United States Patent
Chiao (10) Patent No.: US 10,302,808 B2
(45) Date of Patent: May 28, 2019

(54) GRAVITATIONAL RADIATION COMMUNICATION SYSTEM COMPRISING A SUPERCONDUCTING MOVABLE MEMBRANE BETWEEN CYLINDRICAL SUPERCONDUCTING CAVITIES TO PROVIDE PARAMETRIC AMPLIFICATION

(71) Applicant: THE REGENTS OF THE UNIVERSITY OF CALIFORNIA, Oakland, CA (US)

(72) Inventor: Raymond Chiao, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 93 days.

(21) Appl. No.: 15/548,375

(22) PCT Filed: Feb. 25, 2016

(86) PCT No.: PCT/US2016/019567
§ 371 (c)(1),
(2) Date: Aug. 2, 2017

(87) PCT Pub. No.: WO2016/138266
PCT Pub. Date: Sep. 1, 2016

(65) Prior Publication Data
US 2018/0017704 A1     Jan. 18, 2018

Related U.S. Application Data

(60) Provisional application No. 62/121,044, filed on Feb. 26, 2015.

(51) Int. Cl.
*H01P 7/06*     (2006.01)
*G01V 7/00*     (2006.01)
(Continued)

(52) U.S. Cl.
CPC .............. *G01V 7/00* (2013.01); *H01B 12/06* (2013.01); *H01B 12/12* (2013.01); *H01L 39/08* (2013.01);
(Continued)

(58) Field of Classification Search
CPC .......... G01V 7/00; H01B 12/06; H01B 12/12; H01L 39/14; H01P 7/04; H01P 7/06
(Continued)

(56) References Cited

U.S. PATENT DOCUMENTS

| 3,493,809 A * | 2/1970 | Weissman ............... H01J 23/24 29/599 |
| 6,300,614 B1 | 10/2001 | Petlan |
| 2004/0130237 A1 | 7/2004 | Baker, Jr. |

OTHER PUBLICATIONS

International Preliminary Report on Patentability dated Aug. 29, 2017, issued in International Application No. PCT/US2016/019567, 7 pages.
(Continued)

*Primary Examiner* — Que Tan Le
(74) *Attorney, Agent, or Firm* — Lewis Roca Rothgerber Christie LLP (57) ABSTRACT

A gravitational radiation communication system. The system includes a gravitational radiation transmitter and a gravitational radiation receiver. Each of the transmitter and the receiver includes a first cylindrical superconducting cavity, having a first length, a first diameter, and an entrance aperture for electromagnetic radiation; a second cylindrical superconducting cavity, having a second length, a second diameter, and a first aperture for gravitational radiation, the second cavity being coaxial with and adjacent the first cavity; and a superconducting movable membrane positioned between the first cavity and the second cavity and configured to provide parametric amplification of electro-
(Continued)

magnetic fields in the second cavity. The first aperture is configured to pass gravitational radiation.

27 Claims, 8 Drawing Sheets

(51) Int. Cl.
    *H01L 39/08*     (2006.01)
    *H01L 39/14*     (2006.01)
    *H01B 12/06*     (2006.01)
    *H01B 12/12*     (2006.01)
    *H01P 7/04*     (2006.01)

(52) U.S. Cl.
    CPC ................ *H01L 39/14* (2013.01); *H01P 7/04* (2013.01); *H01P 7/06* (2013.01)

(58) Field of Classification Search
    USPC .................................................. 250/227.11
    See application file for complete search history.

(56) References Cited

OTHER PUBLICATIONS

Chiao, Raymond Y.; ""Millikan oil drops" as quantum transducers between electromagnetic and gravitational radiation"; Phys. Rev. D; Feb. 25, 2007; pp. 1-31.

\* cited by examiner

GRAVITATIONAL RADIATION COMMUNICATION SYSTEM COMPRISING A SUPERCONDUCTING MOVABLE MEMBRANE BETWEEN CYLINDRICAL SUPERCONDUCTING CAVITIES TO PROVIDE PARAMETRIC AMPLIFICATION

CROSS-REFERENCE TO RELATED APPLICATION(S)

This application is a National Phase Patent Application of, and claims priority to and the benefit of International Patent Application Number PCT/US2016/019567, filed on Feb. 25, 2016, which claims priority to and the benefit of U.S. Provisional Application No. 62/121,044 filed Feb. 26, 2015, entitled "GRAVITATIONAL RADIATION COMMUNICATION SYSTEM", the entire contents of all of which are incorporated herein by reference.

GOVERNMENT LICENSE RIGHTS

This invention was made with U.S. Government support Contract No. W911NF-14-C-0061 awarded by the Defense Advanced Research Projects Agency. The U.S. Government has certain rights in this invention.

BACKGROUND

1. Field

One or more aspects of embodiments according to the present invention relate to communications systems, and more particularly to a communications system employing gravitational radiation.

2. Description of Related Art

Related art communications systems generally rely on signals that propagate through free space or in waveguide structures such as optical fibers. Such systems may rely on electromagnetic waves or acoustic waves. Both electromagnetic waves and acoustic waves interact with matter and may suffer from propagation loss when propagating through matter, depending on the type of matter, and the type and frequency of wave. The need to avoid interfering with existing communications systems may constrain the operations of certain types of communications systems, with much of the radio frequency spectrum for free-space electromagnetic waves being allocated to particular applications or licenses. Related art communications systems that send information above ground around the earth may require wave guides (e.g., fiber-optic cables) or (e.g., satellite) repeaters, which may be costly to set up and maintain.

Thus, there is a need for a communications system that does not interfere with related art communications systems, and that may be used to send communications through the earth without requiring waveguides or repeaters.

SUMMARY

According to some embodiments of the present invention there is provided a gravitational radiation communication system including a gravitational radiation transmitter and a gravitational radiation receiver; each of the transmitter and the receiver including: a first cylindrical superconducting cavity, having a first length, a first diameter, and an entrance aperture for receiving electromagnetic radiation, the first cavity being configured to generate resonant standing electromagnetic waves; a second cylindrical superconducting cavity, having a second length, a second diameter, and a first exit aperture, the second cavity being coaxial with and adjacent the first cavity; and a superconducting movable membrane positioned between the first cavity and the second cavity and configured to respond to the resonant standing electromagnetic waves to provide parametric amplification of one selected from the group consisting of: any electromagnetic fields present in the second cavity, and any gravitational radiation present in the second cavity, wherein the first exit aperture is configured to pass parametrically amplified gravitational radiation.

In some embodiments, the system includes: a third cylindrical superconducting cavity, having a third length, a third diameter, and a second exit aperture, the third cavity being coaxial with and adjacent the second cavity; and a superconducting iris positioned between the second cavity and the third cavity, the iris having an aperture, wherein the second exit aperture is configured to pass parametrically amplified gravitational radiation.

In some embodiments, the aperture of the iris of the transmitter is offset from a central axis of the iris of the transmitter and is configured to couple electromagnetic fields in the second and third cavities.

In some embodiments, each of the iris of the transmitter and the iris of the receiver includes a circular ridge in one surface of the iris, the circular ridge having a width of at least one-tenth the diameter of the third cavity, a radius of at least 0.7 the diameter of the third cavity, and a height of at least 0.01 the diameter of the third cavity.

In some embodiments, the third cavity of the transmitter has a third exit aperture.

In some embodiments, at least a portion of the membrane of the transmitter has a mass per unit area of less than 10 $g/m^2$.

In some embodiments, the second cavity of the transmitter and the third cavity of the transmitter have a first coupled transverse electric 011 (TE011) mode and a second coupled TE011 mode, each of the first coupled TE011 mode and the second coupled TE011 mode having a quality factor (Q) greater than $10^8$.

In some embodiments, each of the transmitter and the receiver further includes a source of electromagnetic radiation and an antenna for coupling the electromagnetic radiation to the first cavity, the antenna being connected to the source of electromagnetic radiation by a conductive waveguide.

In some embodiments, the conductive waveguide is a coaxial cable and the antenna includes a loop antenna.

In some embodiments, the source of electromagnetic radiation is configured to generate electromagnetic radiation at a frequency of about 11.1 GHz.

In some embodiments, each of the first cavity of the transmitter, the second cavity of the transmitter, and the third cavity of the transmitter, has a length of about 1.061 inches and a diameter of about 1.000 inches.

In some embodiments, the system includes, as a major component, superconducting niobium.

In some embodiments, general amplification and signal generation uses can be implemented.

According to some embodiments of the present invention there is provided a gravitational radiation receiver including: a first cylindrical superconducting cavity, having a first length, a first diameter, and an entrance aperture for receiving electromagnetic radiation, the first cavity being configured to generate resonant standing electromagnetic waves; a second cylindrical superconducting cavity, having a second length, a second diameter, and a first exit aperture, the second cavity being coaxial with and adjacent the first cavity; and a superconducting movable membrane positioned between the first cavity and the second cavity and configured to respond to the resonant standing electromagnetic waves to provide parametric amplification of one selected from the group consisting of: any electromagnetic fields present in the second cavity, and any gravitational radiation present in the second cavity, wherein the first exit aperture is configured to pass parametrically amplified gravitational radiation.

In some embodiments, the receiver includes: a third cylindrical superconducting cavity, having a third length, a third diameter, and a second exit aperture for gravitational radiation, the third cavity being coaxial with and adjacent the second cavity; and a superconducting iris positioned between the second cavity and the third cavity, the iris having an aperture, wherein the second exit aperture is configured to pass parametrically amplified gravitational radiation.

In some embodiments, the aperture of the iris is offset from a central axis of the iris and is configured to couple electromagnetic fields in the second and third cavities.

In some embodiments, the iris includes a circular ridge in one surface of the iris, the circular ridge having a width of at least one-tenth the diameter of the third cavity, a radius of at least 0.7 the diameter of the third cavity, and a height of at least 0.01 the diameter of the third cavity.

In some embodiments, the third cavity has a third exit aperture.

In some embodiments, at least a portion of the membrane has a mass per unit area of less than 10 $g/m^2$.

In some embodiments, the second cavity and the third cavity have a first coupled transverse electric 011 (TE011) mode and a second coupled TE011 mode, each of the first coupled TE011 mode and the second coupled TE011 mode having a quality factor (Q) greater than $10^8$.

In some embodiments, the receiver includes a source of electromagnetic radiation and an antenna for coupling the electromagnetic radiation to the first cavity, the antenna being connected to the source of electromagnetic radiation by a conductive waveguide.

In some embodiments, the conductive waveguide is a coaxial cable and the antenna includes a loop antenna.

In some embodiments, the source of electromagnetic radiation is configured to generate electromagnetic radiation at a frequency of about 11.1 GHz.

In some embodiments, each of the first cavity, the second cavity, and the third cavity, has a length of about 1.061 inches and a diameter of about 1.000 inches.

In some embodiments, the receiver includes, as a major component, superconducting niobium.

In some embodiments, the triple-cavity parametric-amplifier is a quantum amplifier/receiver, like a maser.

According to some embodiments of the present invention there is provided a gravitational radiation positioning system including a plurality of gravitational radiation transmitters and a gravitational radiation receiver; each of the plurality of transmitters and the receiver including: a first cylindrical superconducting cavity, having a first length, a first diameter, and an entrance aperture for receiving electromagnetic radiation, the first cavity being configured to generate resonant standing electromagnetic waves; a second cylindrical superconducting cavity, having a second length, a second diameter, and a first exit aperture, the second cavity being coaxial with and adjacent the first cavity; a third cylindrical superconducting cavity, having a third length, a third diameter, and a second exit aperture, the third cavity being coaxial with and adjacent the second cavity; a superconducting movable membrane positioned between the first cavity and the second cavity and configured to respond to the resonant standing electromagnetic waves to provide parametric amplification of one selected from the group consisting of: any electromagnetic fields present in the second cavity, and any gravitational radiation present in the second cavity a superconducting iris positioned between the second cavity and the third cavity, the iris having an aperture, wherein each of the first exit aperture and the second exit aperture is configured to pass parametrically amplified gravitational radiation, and wherein the receiver is configured to calculate a position of the receiver from time information encoded in gravitational radiation received by the receiver from the plurality of transmitters.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a gravitational radiation communication system provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features. Numbers enclosed in square brackets identify references in the list of references provided below.

Superconductors (SC) have been predicted to be mirrors for microwave-frequency gravitational waves. A moving, SC-coated membrane therefore may be a moving mirror that behaves like a moving piston which can do work, and thereby amplify "signal waves" and "idler waves" (both also referred to as output), including both electromagnetic (EM) and gravitational radiation (GR) microwave radiation fields, contained in high quality factor (high-Q) SC cavities. When a coaxial configuration of three SC cylindrical cavities (a first cavity 105a, a second cavity 105b, and a third cavity 105c, collectively referred to as cavities 105) pumped by EM microwave pump waves is assembled into a parametric amplifier/oscillator system, as sketched in FIG. 1, then a pair of parametric amplifier/oscillator systems can both generate and detect GR microwaves. A GR microwave transmitter and receiver system may be assembled together for global communications and navigation systems (see FIG. 9). In the schematic diagram of FIG. 1, some portions of the assembly are illustrated as transparent for the sake of convenience, so that interior elements are visible.

Transmitter

Figure 1:
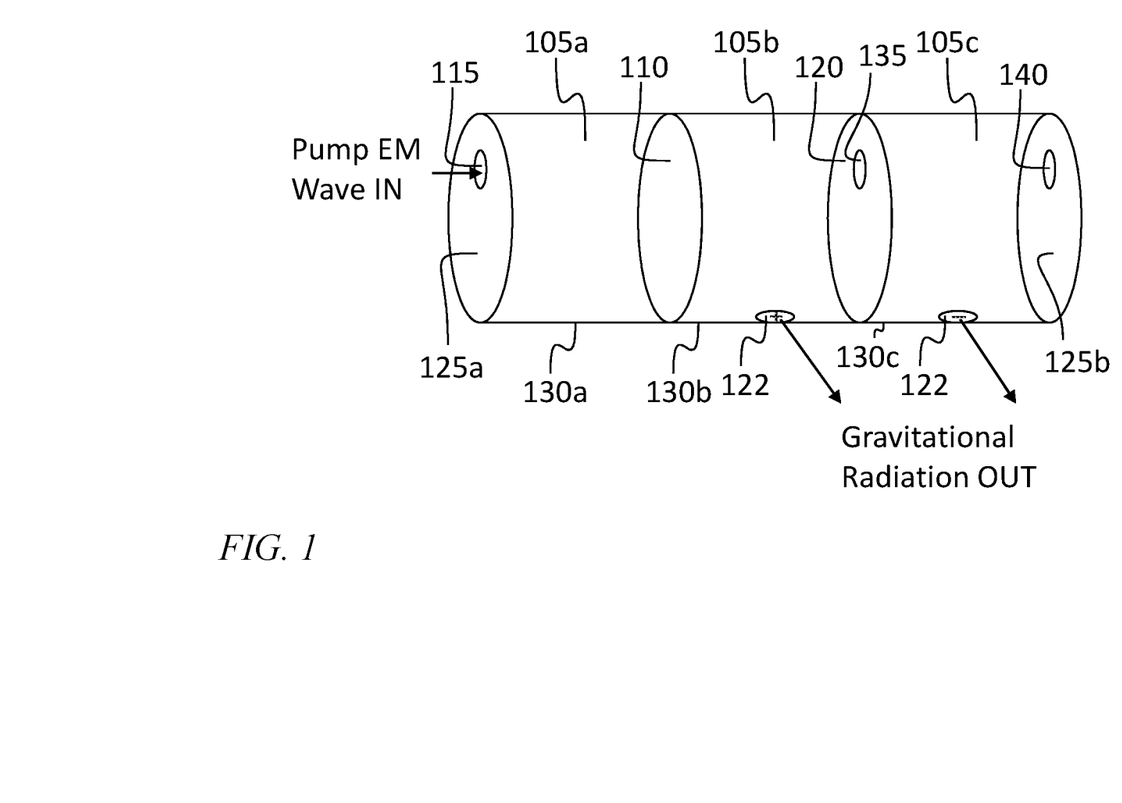
FIG. 1 is a schematic illustration of a gravitational wave transmitter, according to an embodiment of the present invention.

In the embodiment of FIG. 1, a gravitational wave transmitter includes a system of three coaxial, coupled superconducting (SC) cavities 105. All three cavities are nearly identical, but have slight differences in length (e.g., differing by about a part in a thousand) in order to break the degeneracy that may otherwise be present between pump, signal, and idler frequencies (e.g., at around 10 GHz the degeneracy may be broken by around 10 MHz). This non-degeneracy may be used to prevent confusion between the high-power signal strength of the pump wave and the low-power signal strengths of the signal and idler waves. If the pump, signal, and idler are at the same frequency (i.e., at degeneracy), any leakage from the first cavity or "pump cavity" 105a into the signal/idler cavities 105b, 105c may degrade the signal-to-noise ratio. Thus, breaking this degeneracy may improve the signal-to-noise ratio. In some embodiments, the SC cavities 105 have equal inside diameters (I.D.) of 1.000 inch for all three cavities 105, and finely adjustable lengths of 1.061+/−0.001 inch.

In some embodiments, piezo-electric actuators are used to tune the cavities 105 to slightly different frequencies. The SC cavities are resonantly excited in their TE011 modes near 11.1 GHz. The first cavity 105a of FIG. 1 is the pump cavity 105a that is being resonantly filled, through an entrance aperture 115, with the incoming pump electromagnetic wave, such that the oscillating SC membrane 110 is driven on one side (left side in FIG. 1) by magnetic field pressure into mechanical oscillations at 22.2 GHz. These reciprocating, piston-like actions of the oscillating SC membrane 110 result in the amplification process of this parametric amplifier. The free-mass, mechanical oscillations of the oscillating SC membrane 110 at 22.2 GHz amplify signal and idler waves at a doublet of frequencies on the other side (right side in FIG. 1) of the membrane at the upper and lower sidebands on either side of the pump frequency of 11.1 GHz, such that the two signal/idler cavities 105b, 105c, that are separated by an iris 120, fill up with waves at the signal and idler frequencies, which coincide with these upper and lower sidebands, in the process of four-wave parametric amplification. Above a certain threshold in which the gain exceeds the loss (like in a laser), the signal and idler waves build up exponentially starting from vacuum fluctuations, and fill up the two signal/idler cavities 105b, 105c, in the process of parametric oscillation. This happens for both electromagnetic (EM) and gravitational radiation (GR) signal and idler waves. Above threshold, the resulting GR signal wave escapes into space outside the two signal/idler cavities 105b, 105c, through two holes or "GR exit apertures" 122 as the outgoing gravitational radiation (or "GR waves") exiting from the transmitter system.

In some embodiments, EM pump microwaves enter the pump cavity 105a through the entrance aperture 115, which represents an opening through which an SMA cable (i.e., a coaxial cable having an SMA connector at one end, connected to a microwave source) that terminates in a loop antenna at or in the entrance aperture 115 may excite the TE011 mode (which may be a high-Q mode) of the pump cavity 105a. The microwave source, the SMA cable, and the loop antenna are not shown in FIG. 1. The recessed loop antenna is evanescently under-coupled to the high-Q TE011 mode, e.g., it is coupled to evanescent waves of this mode that extend into the entrance aperture 115. The loop is recessed into the hole that forms the entrance aperture 115 so that the waveguide cutoff of this hole leads to an evanescent coupling of the loop to the exponential tail of the magnetic field that enters inside the hole. In other words, the aperture 115 has sufficiently small transverse dimensions that it does not support propagating modes at the pump, signal, or idler frequencies, and thus only evanescent waves are present within the aperture. These evanescent waves include electric and magnetic fields, and the loop antenna couples to the latter. In some embodiments a microwave pump with a power of around −10 dBm is supplied to the loop antenna. The loop is oriented such that the magnetic flux coupling to the local evanescent magnetic field in the aperture of the TE011 mode is maximized, i.e., the loop is azimuthally oriented with respect to the cylindrical axis of the pump cavity 105a. The loop antenna may be formed, for example, by connecting the center conductor of the coaxial cable to the shield (i.e., the ground conductor) with a loop a few mm in diameter. The SMA cable is under-coupled to the pump cavity 105a, i.e., the coupling is adjusted to be sufficiently weak to avoid spoiling the Q of the pump cavity 105a.

In some embodiments, the entrance aperture 115 is a hole with a diameter of 2.2 mm, and offset from the central axis by 6.1 mm, that is machined into a solid cylindrical (i.e., a right circular cylinder, the height of which may be less than its radius) superconducting (SC) niobium first endplate 125a, which slip-fits smoothly into the inner diameter of the cylindrical, high-Q SC niobium pump cavity 105a, following the design of the movable tuning plunger of the Hewlett Packard wavemeter. This allows a fine tuning of the resonance frequency of the pump cavity by moving the first endplate 125a axially. An insulating annular gap between the circumferential outer edge of first endplate 125a and the inner wall of the cylindrical wall is provided to suppress the low-Q, degenerate TM111 mode of the pump cavity 105a. The TM111 mode may also be suppressed by means of a depressed groove machined into the face of the first endplate 125a. The gap may be a vacuum gap circumferentially around the first endplate 125a, so that the first endplate 125a, like the "plunger" of the Hewlett Packard wavemeter, can be free to move relative to a longitudinal axis of the cylindrical pump cavity 105a so as to be able to tune the desired TE011 resonance frequency.

The transmitter is operated in a cryostat, which may be cooled by a dilution refrigerator. In some embodiments, high vacuum is not required during cooling or during operation and may significantly slow the cooling of the niobium, because radiative cooling may be slow at cryogenic temperatures. Prior to cooling, a small amount helium isotope 3 gas may be admitted into the sample can of the cryostat as a heat exchange gas, so as to cool the niobium cavities more quickly, and then pumped out during operation. The earth's magnetic field is screened out to the level of 10 mG or less, during cooling, to avoid the Q of the niobium cavities 105 being spoiled due to flux (or vortex) trapping on the inner surface of the cavities 105. This screening may be accomplished using mu-metal shields, available for example from Amuneal Manufacturing Corp., of Philadelphia, Pa.

In some embodiments, the three substantially identical cylindrical walls of the three cylindrical SC cavities 105 (each with an I.D. of one inch) are machined out of niobium tubes 130a, 130b, 130c. The inner surfaces of these niobium tubes 130a, 130b, 130c, the niobium first endplate 125a, the iris 120 (which may be composed of niobium), and a niobium second endplate 125b undergo a chemical treatment process in order to achieve high quality factors at microwave frequencies. The quality factors of such cylindrical superconducting radio frequency (SRF) cavities 105 may be higher than a billion.

Figure 2:
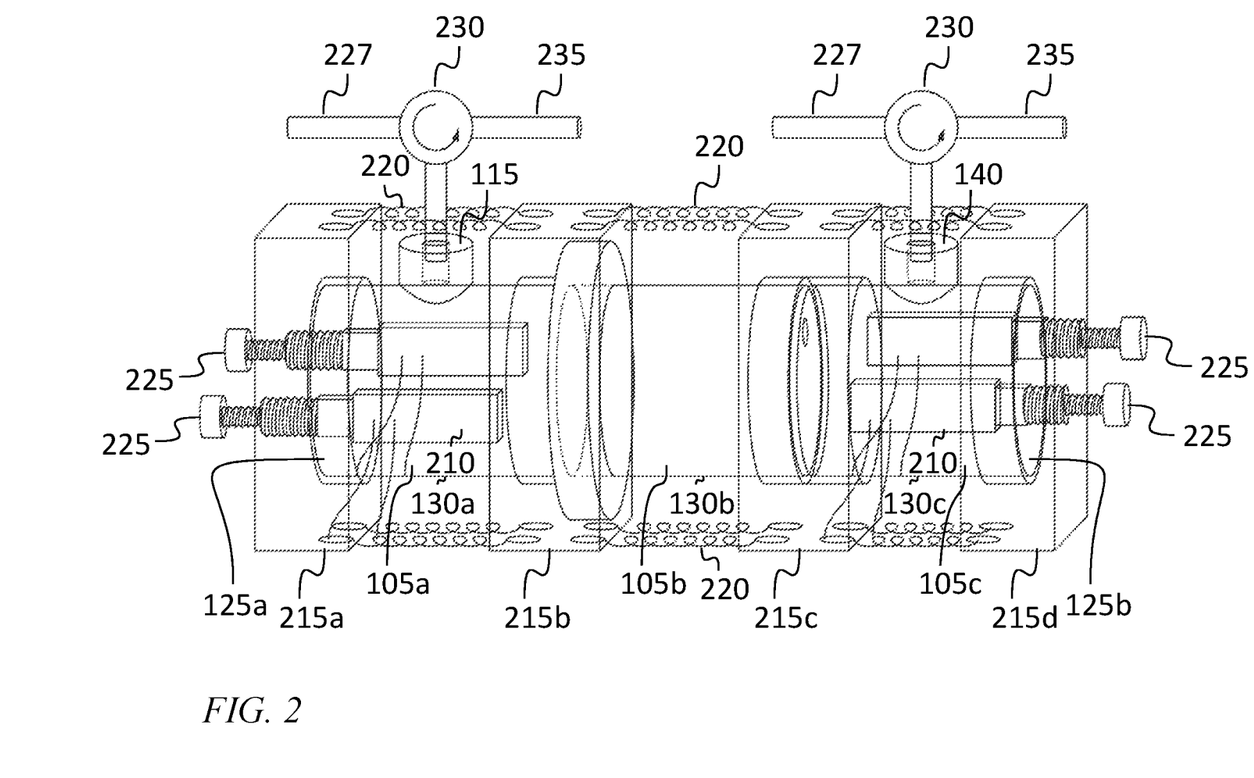
FIG. 2 is an illustration of a gravitational wave transmitter, according to another embodiment of the present invention.
Figure 5A:
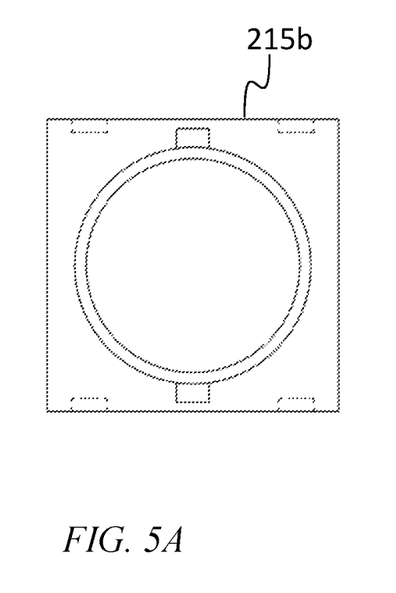
FIG. 5A is a plan view of a second square holding plate, according to an embodiment of the present invention.

The pump cavity 105a is generally enclosed by the SC first endplate 125a on one side (left side in FIG. 1) and by the oscillating SC membrane 110 on the other side (right side in FIG. 1). The oscillating SC membrane 110 (or "movable membrane") is fabricated out of a silicon nitride film substrate (500 nm thick) coated on one side by a superconducting niobium film (300 nm thick). The perimeter of the silicon nitride film is anchored during the fabrication process onto a one-inch inner diameter circular window frame which may be made, out of a single piece of an etched silicon wafer substrate, by Norcada, Inc., of Edmonton, Alberta, Canada. The membrane may be fabricated to the following requirements:

Frame size and thickness: 50.8 mm diameter (±1 mm), 500 µm±25 µm thick
Membrane: low stress silicon nitride, 500 nm±10 nm thick.
Membrane coating: Nb thin film, 300 nm±10 nm thick.
Window size: 35 mm diameter±0.5 mm, almost-circular In addition to having applications in transmitters and receivers of gravitational radiation, such a membrane may be used for producing squeezed states in quantum information processing (quantum computers). The window frame may be sandwiched in between two bracketing square aluminum plates. These two plates may have precisely machined holes having a diameter in which niobium tubes 130a and 130b are a tight fit, and they may be secured together with threaded fasteners and also serve to align the two cylindrical axes of the pump cavity and the middle signal/idler cavity 105b onto a single central axis, as well as to clamp down onto both sides of the window frame of the membrane 110. In another embodiment, the membrane frame is supported against an internal step, as illustrated in FIG. 5 and described in further detail below. In this way, the membrane 110 is fixed in place, and the distance between the first endplate 125a and the membrane 110 can be finely adjusted by means of a piezo-electric transducer 210 (FIG. 2) squeezed between a square holding plate 215a (FIG. 2) for the first endplate 125a that also serves as the holder for one end (left end in FIG. 2) of tube 130a and a second square holding plate 215b (FIG. 2). These two square holding plates 215a, 215b may be fabricated out of aluminum. The resonance frequency of the pump cavity 105a can be finely tuned by adjusting a voltage applied to the piezo-electric transducer 210.

In some embodiments, similarly to the membrane 110, the iris 120 that separates the two signal/idler cavities 105b, 105c is sandwiched between two aluminum square brackets, with precisely machined holes, that also serve to align the two cylindrical axes of the two signal/idler cavities 105b, 105c onto a single central axis. The off-center aperture 135 of the iris 120 is 5.1 mm+/−0.05 mm in diameter and is displaced from the central cylindrical axis by 6.1 mm+/−0.06 mm. The resulting spectral doublet of resonances produced by the iris 120, in conjunction with the two signal/idler cavities 105b, 105c, may be separated by 7.1 MHz. In other embodiments the separation may be larger or smaller. The upper and lower members of the spectral doublet are used for resonating the signal and idler frequencies of the parametric amplifier/oscillator with respect to the pump frequency, such that twice the pump frequency is equal to the sum of the signal and idler frequencies, which is referred to herein as "the four-wave parametric amplification condition". A depressed groove may be formed in one surface of the iris and used for breaking the degeneracy between the high-Q TE011 mode and the low-Q TM111 mode. The use of such a groove may be optional, because the vacuum gap (due to the slip fit) between the cylindrical end plates 125a, 125b and the cylindrical walls of the outer cavities 105a, 105c may already break this degeneracy. Electromagnetic waves may propagate out of the right-most cavity 105c through an electromagnetic wave exit aperture 140 described in further detail below.

In some embodiments, similarly to the mechanism for the fine tuning of the pump cavity 105a, another piezo-electric transducer 210 is squeezed into the space between another two square holding plates 215c, 215d (FIG. 2) that are attached to the fixed iris 120 and to the movable (i.e., slip-fit) second endplate 125b, respectively. This second transducer 210 allows fine adjustment of the length of the third cavity 105c in order to tune its resonance frequency relative to the pump resonance frequency of the first cavity 105a, such that the four-wave parametric amplification condition is satisfied.

The second cavity 105b is the master oscillator, with respect to which the first and third cavities 105a, 105c are offset-frequency-locked by means of piezo-electric tuning of the first and third cavities 105a, 105c via a servo loop electronics system, such that the four-wave parametric amplification condition is satisfied. The servo loop consists of a closed-loop frequency control scheme that uses LABVIEW™ to drive the microwave pump wave generator (or "signal generator") and the piezo-electric tuning hardware for tuning the lengths of the first and third cavities 105a, 105c in order to satisfy the four-wave parametric amplification condition. Deviations from the four-wave parametric amplification condition may be measured by measuring the beat frequencies (i.e., IF frequencies) between the frequencies of the local oscillators locked onto the cavities and computer-generated synthesized frequencies that satisfy the four-wave parametric amplification condition.

Like the entrance aperture 115, the electromagnetic wave exit aperture 140 is, in some embodiments, a hole machined into the solid cylindrical SC niobium second endplate 125b, which again slip-fits smoothly into the inner diameter of the high-Q SC niobium signal/idler third cavity 105c, again following the design of the movable tuning plunger of the Hewlett Packard wavemeter. This once again allows a fine tuning of the resonance frequency of the signal/idler third cavity 105c, and completes the servo loop. Once again, a depressed groove may be machined into the face of the second endplate 125b so as to suppress the undesirable TM111 mode.

Electromagnetic signal and idler microwaves exit from the third cavity 105c through the aperture, or "electromagnetic wave exit aperture" 140, which represents an opening through which an SMA cable that terminates in a loop antenna (again not shown) will couple to the TE011 mode of the third cavity 105c. This recessed loop antenna is evanescently under-coupled to this high-Q mode. The signal on the SMA cable may be used as a diagnostic to confirm that the parametric oscillator is working above threshold, like a laser above threshold, and it may be more convenient to monitor this signal than to monitor the amplitude of gravitational radiation generated by the transmitter. When the parametric oscillator is well above its threshold, the signal and idler levels may be comparable to the pump power level, i.e., on the order of −10 dBm (according to the Manley-Rowe relations).

Thus, a parametric amplifier, and above a certain threshold power for the EM pump microwaves, a parametric oscillator, can be constructed. The threshold power condition for the configuration in FIG. 1 may be identical to a threshold formula for a triple Fabry-Perot configuration. For quality factors of a billion for all three SC cavities placed inside a dilution refrigerator at a temperature of a few tens of millikelvin, for pump, signal, and idler frequencies near 11.1 GHz, and for a one-inch-inner-diameter circular SC niobium-coated silicon nitride oscillating SC membrane 110 with a mass of 3 milligrams, the threshold power for the injected pump microwaves entering the pump cavity at the entrance aperture 115 is 200 microwatts. Therefore the generation of gravitational wave output near 11.1 GHz from the GR exit apertures 122 of the transmitter depicted in FIG. 1 may be readily achieved using existing technologies.

According to the Manley-Rowe relations, i.e., by a quantum-counting argument, the output signal and idler power levels may be comparable to the pump power level, i.e., on the order of −10 dBm. In some embodiments, the maximum conversion efficiency to GR wave power is 25% by a quantum-counting argument.

Details of Triple-Cavity Design

FIG. 2 shows the design for the triple cavity, according to some embodiments. The embodiment of FIG. 2 differs from that of FIG. 1 in several respects not essential to the operation of the system. For example, the entrance aperture 115 and the electromagnetic wave exit aperture 140 are in the cylindrical walls of the respective cavities 105a, 105c instead of in the end plates 125a, 125b, and the dimensions of the cavities differ between the two embodiments. Niobium tubes are held together between a set of niobium blocks (left end plane, membrane plane, iris plane and right end plane). Each cavity is 26.9 mm long and has an inner diameter of 38.1 mm. The system is assembled so that three nearly identical cylindrical cavities made from niobium are concatenated end to end. The membrane plane and iris plane square holding plates 215b, 215c are machined with a cylindrical pocket having a diameter such that the tubes fit tightly at the membrane plane and the iris plane. The left and right square holding plates 215a, 215d have pockets machined for a slip fit so that the effective cavity length can be adjusted. Springs 220 are attached to hold the cavities together under tension. The first, second, third and fourth square holding plates 215a, 215b, 215c, and 215d of FIG. 2 are collectively referred to as square holding plates 215.

Cavity length adjustment against the restoring force of the springs 220 provides frequency tuning of the pump cavity 105a and the third cavity 105c, but the second cavity 105b is fixed and is the master reference for other system frequencies. Coarse cavity length tuning of the pump cavity 105a and third cavity 105c is achieved by using tuning screws 225 which push against a piezoelectric transducer (PZT) 210. A shim is positioned between the ends of the tuning screws 225 and the PZTs 210 to prevent damage to the PZTs 210. Adjusting the amount of screw insertion adjusts the cavity length of the pump cavity 105a and the third cavity 105c. Fine frequency tuning of the pump cavity 105a and the third cavity 105c is accomplished by applying DC voltages to the PZTs 210.

Microwave "pump" energy from a signal generator, not shown, is supplied to the RF in port 227 of a circulator 230 and injected at the entrance aperture 115 on the pump cavity 105a. The pump field passes through the circulator 230 which directs energy toward the pump cavity 105a. The pump field is coupled to the TE011 mode of the cylindrical pump cavity 105a by evanescent field coupling across a short waveguide section. A loop antenna is recessed within the short waveguide whose dimensions are such that the pump field is beyond cutoff. A small amount of radiation tunnels into the pump cavity. The reflection goes back through the circulator and is directed towards the S11 port 235. The TE011 pump mode resonance is monitored from the S11 port 235.

In some embodiments, a small amount of microwave energy from the same signal generator is used to monitor the resonance frequency of the TE011 mode in the third cavity 105c. That energy is similarly coupled to the cavity through the RF in port 227 of a circulator 230 attached to an antenna recessed in the electromagnetic wave exit aperture 140, in the third cavity 105c. The TE011 resonance doublet of the two signal/idler cavities 105b, 105c is monitored from the S11 port 235 on this circulator 230.

Figure 3A:
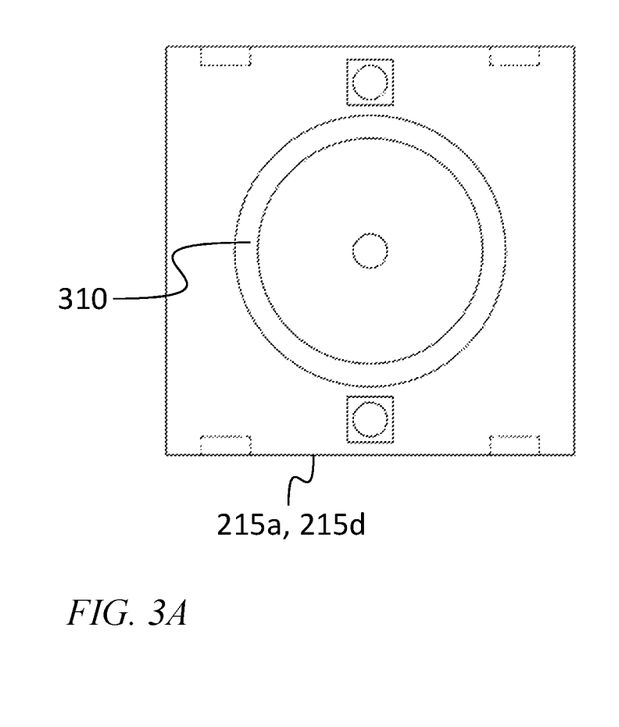
FIG. 3A is a plan view of a first or fourth square holding plate, according to an embodiment of the present invention.
Figure 3B:
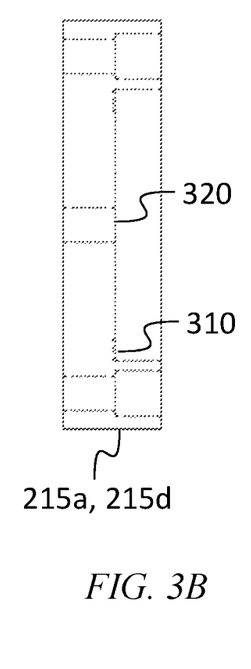
FIG. 3B is a side view of a first or fourth square holding plate, according to an embodiment of the present invention.

Referring to FIGS. 3A and 3B, in some embodiments, a groove 310 on the end of the pocket in each of the first and fourth square holding plates 215a, 215d is used to remove the degeneracy in the TE011 and TM111 modes of the pump cavity 105a and the third cavity 105c. These grooves are 0.500 mm deep. The diameter of the pocket is 38.1 mm. Each end plane may have a circular central hole 320 to allow air to escape when vacuum is drawn on the system. The hole may be prevented from spoiling the Q of the cavity both by centering it (the modes of interest having a null at the center of the each square holding plate 215) and by arranging for its depth to be sufficient, and its diameter sufficiently small, that it forms a waveguide that is cut off at the frequency of operation.

Figure 4A:
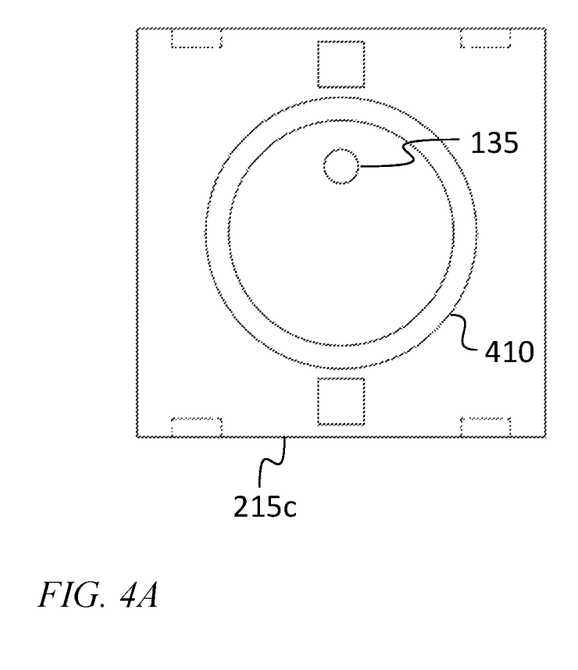
FIG. 4A is a plan view of a third square holding plate, according to an embodiment of the present invention.
Figure 4B:
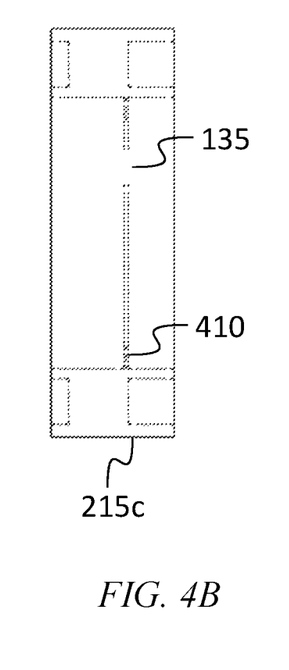
FIG. 4B is a side view of a third square holding plate, according to an embodiment of the present invention.

Referring to FIGS. 4A and 4B, in some embodiments the third square holding plate 215c, or "iris plane", is machined as one piece out of niobium. It has two symmetric pockets to fit the tubes snugly. A thin layer of niobium is left dividing the two pockets; this layer, in which an aperture 135 is drilled off center at 48% of the radius, forms an iris 120. In this case a ridge 410 is left on the middle-cavity side (i.e., the side facing into the second cavity 105b) of the piece as the mechanism to break the TE011, TM111 degeneracy.

Figures 5B, 5C:
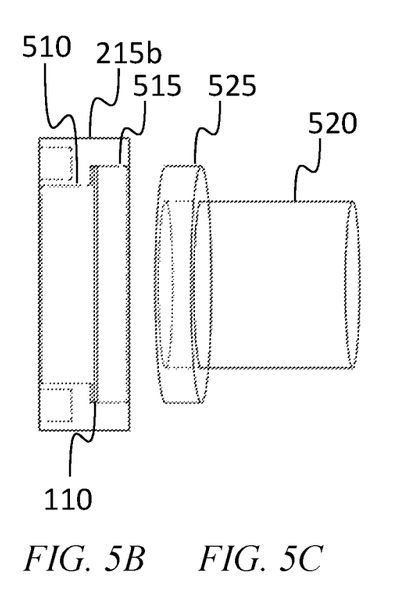
FIG. 5B is a side view of a second square holding plate, according to an embodiment of the present invention.
FIG. 5C is a perspective view of a tube with a flange, according to an embodiment of the present invention.

Referring to FIGS. 5A, 5B, and 5C, in some embodiments the second square holding plate 215b, or "membrane plane"

is machined out of a single piece of niobium. It has two pockets 510, 515 of different diameters. The smaller pocket 510 extends toward the pump cavity 105a and is large enough to fit the outer diameter of the pump cavity tube tightly. The larger pocket 515 extends toward the second cavity 105b. Its diameter is large enough to accommodate the oscillating SC membrane 110 (including its frame) in a manner where the frame rests on the surface separating the large pocket 515 and the small pocket 510. The oscillating SC membrane 110 includes a silicon nitride window coated on one side with 500 nm of niobium metal. The coated side faces the second cavity 105b. The tube 520 on the second cavity 105b is machined with a flange 525 which presses against the frame of the oscillating SC membrane 110 and holds it in place. The tube flange 525 fits snugly in the larger pocket 515 but is also held in place by the tension of the springs.

Frequency Control Scheme

In the embodiment of FIG. 2, there is length adjustment capability on the pump cavity 105a and on the third cavity 105c by both coarse tuning screws and piezo-electric transducers 210. The expression for the cavity frequency is given by:

$$f = \sqrt{\left(\frac{c*3.8317}{\pi d}\right)^2 + \left(\frac{c}{2l}\right)^2},$$

where c is the speed of light, d is the inner diameter of the cavity, and l is the length.

Figure 6A:
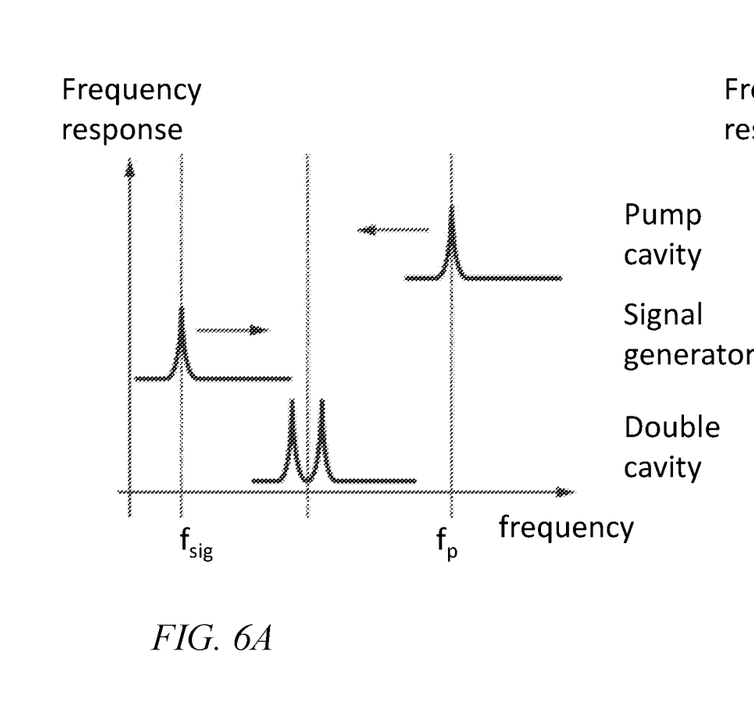
FIG. 6A is a graph of the frequency response of three elements of a system in an unlocked state, according to an embodiment of the present invention.
Figure 6B:
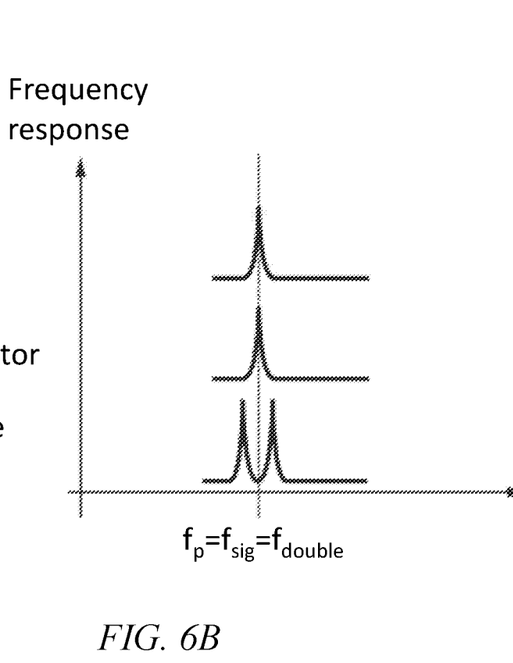
FIG. 6B is a graph of the frequency response of three elements of a system in a locked state, according to an embodiment of the present invention.

FIGS. 6A and 6B show frequency response plots showing the spectral behavior of the pump cavity 105a, the signal generator, and the two signal/idler cavities 105b, 105c. The top curve represents the pump cavity 105a, the middle curve represents the signal from the signal generator, and the bottom curve (the doublet) represents the response of the two signal/idler cavities 105b, 105c. FIG. 6A shows the spectral characteristics when the system is not locked and FIG. 6B shows the spectral characteristics when the system is locked. The locking approach is outlined in the following paragraphs.

First, the length of the third cavity 105c is adjusted until the doublet of modes is symmetrical, i.e., until the amplitude, in the frequency response from the RF input to the S11 output of the right cavity circulator, of each of the two corresponding peaks is the same. Coarse tuning is done at room temperature using the coarse tuning screws 225. Fine tuning is done at cryogenic temperatures by using the PZTs 210. The frequency response is measured by providing a swept RF signal to the RF input of the circulator connected to the third cavity 105c, and monitoring the power at the S11 output 235 of the circulator with a power detector. Once the length of the right cavity has been set using this approach, it may be left unchanged during operation.

Figure 7:
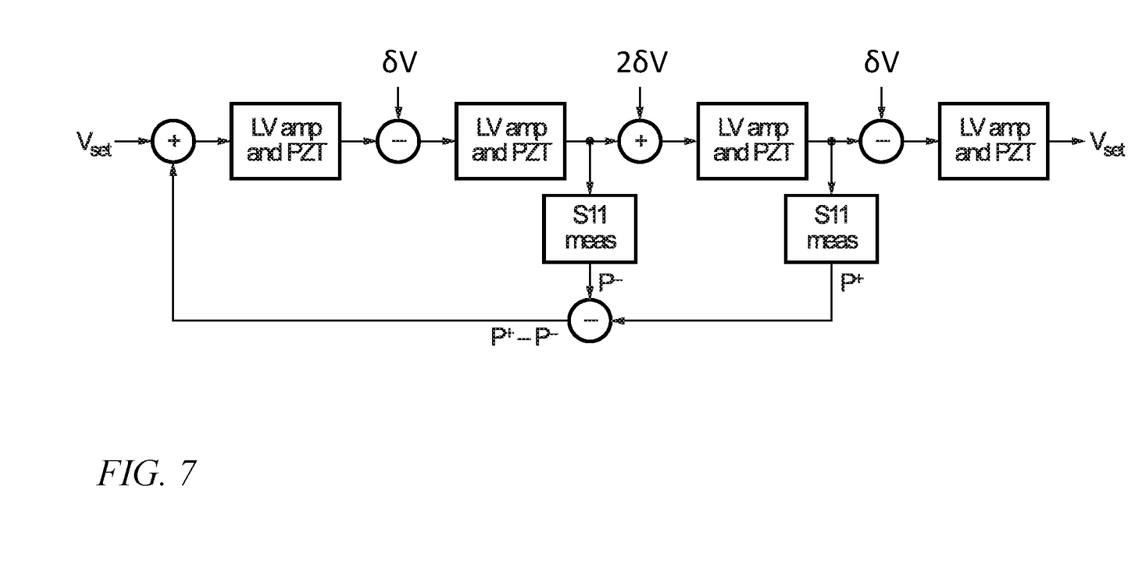
FIG. 7 is a hybrid block-flow diagram of a system and method for adjusting a voltage on a piezo-electric transducer, according to an embodiment of the present invention.

Next, the signal generator frequency is fixed to the center frequency of the doublet. The peak position of the pump cavity 105a is adjusted to be in resonance with the signal generator by scanning the PZT 210 of the pump cavity 105a and recording, with a power detector, the power at the S11 output of the pump cavity circulator as a function of frequency. Once the peak is located the PZT voltage is recorded as $V_{set}$. "Peak position tracking" may then be done by discrete dithering of the PZT voltage by a small amount relative to the resonance width. This may be performed using the process illustrated in FIG. 7. The PZT 210 of the pump cavity 105a is tuned to its setpoint minus some small voltage ($V_{set}-\delta V$) and the S11 signal is recorded as P⁻. The PZT 210 of the pump cavity 105a is then tuned to its setpoint plus some small voltage ($V_{set}+\delta V$) and the S11 signal power, as indicated on the power detector, is recorded as P⁺. The difference $\delta P=(P^+)-(P^-)$ is called the "error signal". If the error signal is positive and larger than a threshold setting, the setpoint of the PZT 210 of the pump cavity 105a is increased by an amount small compared with the linewidth of the resonance. If the error signal is negative and larger than a threshold setting, the setpoint of the PZT 210 of the pump cavity 105a is decreased by an amount small compared with the linewidth of the resonance. Otherwise the setpoint is left unchanged. This loop runs until the setpoint, $V_{set}$, is stable.

Receiver

The receiver system differs from the transmitter system in that the pump microwaves are square-wave modulated, similar to the method used in a super-regenerative radio reception. However, in contrast to the standard radio method, here it is the first stage amplifier and not the second stage IF amplifier, that undergoes square-wave modulation. A "seed" idler wave is injected backwards via a circulator through the electromagnetic wave exit aperture 140, which again represents an opening through which an SMA cable that terminates in a loop antenna (not shown) couples to the TE011 mode of the pump cavity 105a. This "seed" idler is exponentially amplified with a finite gain, along with the received GR microwave signal that enters through two holes in the receiver that correspond to the GR exit apertures 122 of the transmitter. This recessed loop antenna is again evanescently under-coupled to this high-Q mode. The third terminal 235 of the circulator is the RF output of the receiver, carrying EM microwaves modulated in anti-correlation with the modulation of the received GR signal microwaves. The amplified EM signal power that accompanies the amplified EM idler exits the circulator, and is detected in order to monitor the amount of amplified GR signal power present in the system. Each pump photon that is expended by amplifying an arriving GR signal graviton by stimulated emission, is no longer available for amplifying an EM signal photon. Hence an increase in the arriving GR signal power is accompanied by a decrease in the EM signal power exiting the circulator. The finite exponential gain of the receiver is determined by the duty cycle of the square-wave modulation of the receiver pump EM microwaves.

In both the transmitter and the receiver, EM and GR waves, beginning with vacuum fluctuations, are amplified by the motion of the membrane; thus, there is no moving mass that acts as a source of GR. The dimensions of the GR exit apertures 122 of FIG. 1 may be selected to avoid spoiling the Q of the GR modes in the two signal/idler cavities 105b, 105c while allowing sufficient coupling into or out of the two signal/idler cavities 105b, 105c for GR to be emitted or received. In some embodiments a two-cavity system may be used for either or both of the transmitter and the receiver, with one cavity acting as the pump cavity driving the motion of the membrane, and the other cavity (i.e., a single cavity instead of the two signal/idler cavities 105b, 105c of FIG. 1) being the cavity in which the GR is amplified (beginning from vacuum fluctuations) by the motion of the membrane. In some embodiments the cavities are not cylindrical but have, e.g., a square cross section. In some embodiments the cavities are sections of a curved axis cylinder, instead of a straight cylinder.

The range of this transmitter-receiver system can be calculated using the Serber-Townes formula for the noise temperature (viz., $T = hv/k_B$ where h is Planck's constant, v is the carrier frequency, and $k_B$ is Boltzmann's constant) of a coherent, quantum-limited amplifier, such as a parametric amplifier or a maser. The result of the calculation is, for the range $r_{max}$ for a transmitter with GR output power of 1.5 mW:

$$r_{max} = \frac{\lambda}{2\pi} \sqrt{\frac{P_0}{8\pi hv}} \sqrt{\frac{\tau}{\Delta v}} = 6400 \text{ kilometers}$$

i.e., the range is approximately the radius of Earth, for $\lambda = 2.7$ cm (11 GHz), $\Delta v = 10$ Hz, and $\tau = 1$ second. Since the Earth and its oceans are transparent to gravitational radiation, it may be possible to replace EM microwave communication and GPS navigation systems by GR microwave communication and GPS navigation systems. This may eliminate the need for satellite systems presently being used for EM microwave communication and navigation purposes.

Figure 8:
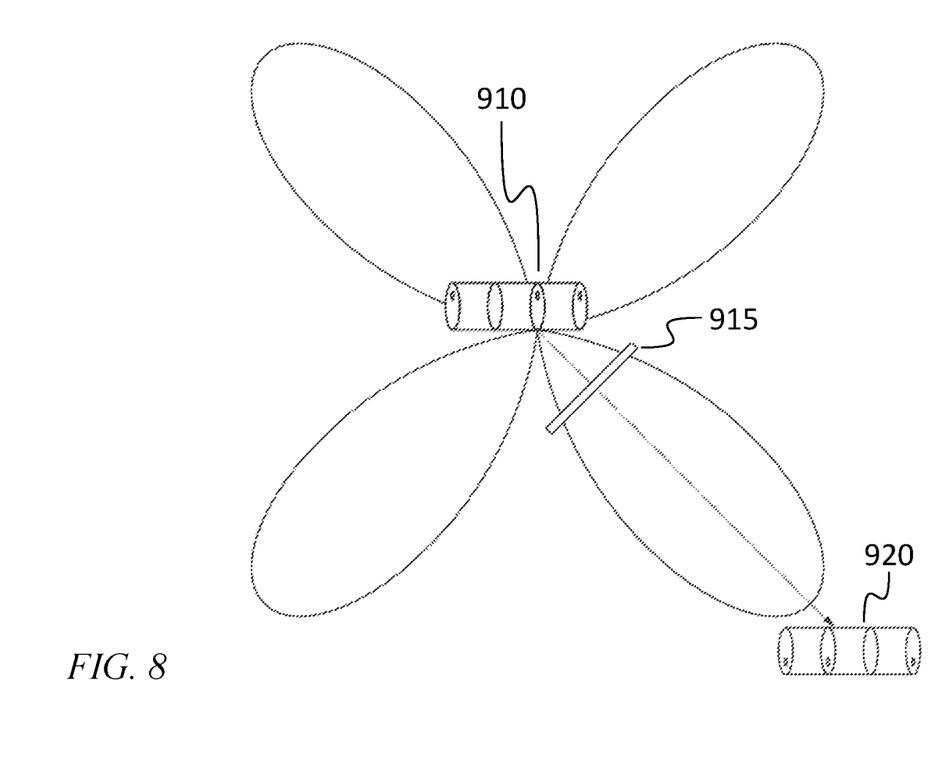
FIG. 8 is a schematic illustration of a gravitational wave communications link, according to an embodiment of the present invention.

In the embodiment of FIG. 8, the gravitational radiation emitted by transmitter 910 is modulated by an external "AM modulator," 915, e.g., an aluminum plate in a time-varying magnetic field around the critical field of approximately 100 Gauss. The modulation is then detected by the receiver 920.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of" when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration.

As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Although limited embodiments of a gravitational radiation communication system have been specifically described and illustrated herein, many modifications and variations will be apparent to those skilled in the art. Accordingly, it is to be understood that a gravitational radiation communication system employed according to principles of this invention may be embodied other than as specifically described herein. The invention is also defined in the following claims, and equivalents thereof.

What is claimed is:

1. A gravitational radiation communication system comprising a gravitational radiation transmitter and a gravitational radiation receiver, each of the transmitter and the receiver comprising:
   a first cylindrical superconducting cavity having a first length, a first diameter, and an entrance aperture for electromagnetic radiation;
   a second cylindrical superconducting cavity having a second length, a second diameter, and a first aperture for gravitational radiation, the second cavity being coaxial with and adjacent the first cavity; and
   a superconducting movable membrane positioned between the first cavity and the second cavity and configured to provide parametric amplification of electromagnetic fields in the second cavity;
   wherein the first aperture is configured to pass gravitational radiation.

2. The system of claim 1, each of the transmitter and the receiver further comprising:
   a third cylindrical superconducting cavity having a third length, a third diameter, and a second aperture for gravitational radiation, the third cavity being coaxial with and adjacent the second cavity; and a superconducting iris positioned between the second cavity and the third cavity, the iris having an aperture, wherein the second aperture is configured to pass gravitational radiation.

3. The system of claim 2, wherein the aperture of the iris of the transmitter is offset from a central axis of the iris of the transmitter and is configured to couple electromagnetic fields in the second and third cavities.

4. The system of claim 2, wherein each of the iris of the transmitter and the iris of the receiver comprises a circular ridge in one surface of the iris, the circular ridge having a width of at least one-tenth the third diameter of the third cavity, a radius of at least 0.7 the third diameter of the third cavity, and a height of at least 0.01 the third diameter of the third cavity.

5. The system of claim 2, wherein the third cavity of the transmitter has a third exit aperture.

6. The system of claim 2, wherein at least a portion of the membrane of the transmitter has a mass per unit area of less than 10 g/m$^2$.

7. The system of claim 2, wherein the second cavity of the transmitter and the third cavity of the transmitter have a first coupled transverse electric 011 ($TE_{011}$) mode and a second coupled $TE_{011}$ mode, each of the first coupled $TE_{011}$ mode and the second coupled $TE_{011}$ mode having a quality factor (Q) greater than $10^8$.

8. The system of claim 2, wherein each of the transmitter and the receiver further comprises a source of electromagnetic radiation and an antenna for coupling the electromagnetic radiation to the first cavity, the antenna being connected to the source of electromagnetic radiation by a conductive waveguide.

9. The system of claim 8, wherein the conductive waveguide is a coaxial cable and the antenna includes a loop antenna.

10. The system of claim 8, wherein the source of electromagnetic radiation is configured to generate electromagnetic radiation at a frequency of about 11.1 GHz.

11. The system of claim 10, wherein each of the first cavity of the transmitter, the second cavity of the transmitter, and the third cavity of the transmitter has a length of about 1.061 inches and a diameter of about 1.000 inches.

12. The system of claim 2, wherein each of the first cavity of the transmitter, the second cavity of the transmitter, and the third cavity of the transmitter has at least one wall comprising, as a major component, superconducting niobium.

13. The system of claim 2 configured as a high-Q superconducting parametric amplifier and oscillator system capable of general amplification and signal generation.

14. A gravitational radiation receiver comprising:
a first cylindrical superconducting cavity having a first length, a first diameter, and an entrance aperture for receiving electromagnetic radiation;
a second cylindrical superconducting cavity having a second length, a second diameter, and a first aperture for gravitational radiation, the second cavity being coaxial with and adjacent the first cavity; and
a superconducting movable membrane positioned between the first cavity and the second cavity and configured to provide parametric amplification of electromagnetic fields in the second cavity;
wherein the first aperture is configured to pass gravitational radiation.

15. The receiver of claim 14, further comprising:
a third cylindrical superconducting cavity having a third length, a third diameter, and a second exit aperture for gravitational radiation, the third cavity being coaxial with and adjacent the second cavity; and
a superconducting iris positioned between the second cavity and the third cavity, the iris having an aperture, wherein the second exit aperture is configured to pass gravitational radiation.

16. The receiver of claim 15, wherein the aperture of the iris is offset from a central axis of the iris and is configured to couple electromagnetic fields in the second and third cavities.

17. The receiver of claim 15, wherein the iris comprises a circular ridge in one surface of the iris, the circular ridge having a width of at least one-tenth the third diameter of the third cavity, a radius of at least 0.7 the third diameter of the third cavity, and a height of at least 0.01 the third diameter of the third cavity.

18. The receiver of claim 15, wherein the third cavity has a third exit aperture.

19. The receiver of claim 15, wherein at least a portion of the membrane has a mass per unit area of less than 10 g/m$^2$.

20. The receiver of claim 15, wherein the second cavity and the third cavity have a first coupled transverse electric 011 ($TE_{011}$) mode and a second coupled $TE_{011}$ mode, each of the first coupled $TE_{011}$ mode and the second coupled $TE_{011}$ mode having a quality factor (Q) greater than $10^8$.

21. The receiver of claim 15, further comprising a source of electromagnetic radiation and an antenna for coupling the electromagnetic radiation to the first cavity, the antenna being connected to the source of electromagnetic radiation by a conductive waveguide.

22. The receiver of claim 21, wherein the conductive waveguide is a coaxial cable and the antenna includes a loop antenna.

23. The receiver of claim 21, wherein the source of electromagnetic radiation is configured to generate electromagnetic radiation at a frequency of about 11.1 GHz.

24. The receiver of claim 23, wherein each of the first cavity, the second cavity, and the third cavity has a length of about 1.061 inches and a diameter of about 1.000 inches.

25. The receiver of claim 15, wherein each of the first cavity, the second cavity, and the third cavity has at least one wall comprising, as a major component, superconducting niobium.

26. The receiver of claim 15, wherein the gravitational radiation receiver is a quantum amplifier/receiver or a maser.

27. A gravitational radiation positioning system, comprising a plurality of gravitational radiation transmitters and a gravitational radiation receiver, each of the plurality of transmitters and the receiver comprising:
a first cylindrical superconducting cavity having a first length, a first diameter, and an entrance aperture for receiving electromagnetic radiation;
a second cylindrical superconducting cavity having a second length, a second diameter, and a first aperture for gravitational radiation, the second cavity being coaxial with and adjacent the first cavity;
a third cylindrical superconducting cavity having a third length, a third diameter, and a second exit aperture for gravitational radiation, the third cavity being coaxial with and adjacent the second cavity;
a superconducting movable membrane positioned between the first cavity and the second cavity and configured to provide parametric amplification of electromagnetic fields in the second cavity; and
a superconducting iris positioned between the second cavity and the third cavity, the iris having an aperture, wherein the first and the second apertures are configured to pass gravitational radiation, and wherein the receiver is configured to calculate a position of the receiver from time information encoded in gravitational radiation received by the receiver from the plurality of transmitters.

* * * * *

UNITED STATES PATENT AND TRADEMARK OFFICE
CERTIFICATE OF CORRECTION

PATENT NO. : 10,302,808 B2  
APPLICATION NO. : 15/548375  
DATED : May 28, 2019  
INVENTOR(S) : Raymond Chiao Page 1 of 1

It is certified that error appears in the above-identified patent and that said Letters Patent is hereby corrected as shown below:

In the Claims

| | |
|---|---|
| In Column 15, Line 17, Claim 5 | delete "a third exit aperture." and insert -- an exit aperture for electromagnetic radiation. -- |
| In Column 15, Line 54, Claim 14 | after "for" delete "receiving" |
| In Column 15, Line 67, Claim 15 | after "second" delete "exit" |
| In Column 16, Line 5, Claim 15 | after "second" delete "exit" |
| In Column 16, Line 19 approx., Claim 18 | delete "a third exit aperture." and insert -- an exit aperture for electromagnetic radiation. -- |
| In Column 16, Line 53, Claim 27 | after "for" delete "receiving" |
| In Column 16, Line 59, Claim 27 | after "second" delete "exit" |

Signed and Sealed this  
Third Day of November, 2020

Andrei Iancu  
*Director of the United States Patent and Trademark Office*